(12) United States Patent
Han

(10) Patent No.: US 7,494,863 B2
(45) Date of Patent: Feb. 24, 2009

(54) METHOD FOR MANUFACTURING CAPACITOR FOR SEMICONDUCTOR DEVICE

(75) Inventor: Chang Hun Han, Icheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 125 days.

(21) Appl. No.: 11/485,361

(22) Filed: Jul. 13, 2006

(65) Prior Publication Data

US 2007/0020869 A1 Jan. 25, 2007

(30) Foreign Application Priority Data

Jul. 14, 2005 (KR) ................. 10-2005-0063734

(51) Int. Cl.
H01L 21/8234 (2006.01)
H01L 21/8244 (2006.01)

(52) U.S. Cl. ............... 438/238; 438/210; 438/253; 438/381; 438/396; 257/E21.008; 257/E21.648

(58) Field of Classification Search ............. 438/238, 438/253, 210, 393, 381; 257/E21.008, E21.01, 257/E21.582, E21.021
See application file for complete search history.

(56) References Cited

U.S. PATENT DOCUMENTS 4,380,755 A * 4/1983 Endlicher et al. ........... 382/324
6,333,224 B1 12/2001 Lee
6,670,237 B1 12/2003 Loh et al.
7,314,806 B2 * 1/2008 Choi et al. ................. 438/393
2004/0149991 A1 * 8/2004 Won ........................ 257/68
2004/0180508 A1 9/2004 Park
2005/0227432 A1 * 10/2005 Choi et al. ................. 438/244
2006/0157766 A1 * 7/2006 Won et al. .................. 257/296

OTHER PUBLICATIONS

First Office Action from the State Intellectual Property Office of People's Republic of China, dated Aug. 3, 2007, In counterpart Chinese Patent Application No. 200610098799.8.
Office Action issued from the State Intellectual Property Office of the People's Republic of China on Jun. 27, 2008, from counterpart Chinese Patent Application No. 200610098799.8.

* cited by examiner

Primary Examiner—Walter L Lindsay, Jr.
Assistant Examiner—Mohsen Ahmadi
(74) Attorney, Agent, or Firm—Finnegan, Henderson, Farabow, Garrett & Dunner, L.L.P.

(57) ABSTRACT

Disclosed is a method for manufacturing a capacitor in a semiconductor device. A method consistent with the present invention includes forming a lower electrode on a semiconductor substrate; forming a first interlevel dielectric layer on an entire surface of the semiconductor substrate, covering the lower electrode; selectively removing the first interlevel dielectric layer to form an opening exposing a surface of the lower electrode; sequentially forming a dielectric layer and a conductive layer over the entire surface of the semiconductor substrate including the opening; planarizing the conductive layer to form an upper electrode in the opening; and forming a second interlevel dielectric layer over the entire surface of the semiconductor substrate including the upper electrode.

6 Claims, 9 Drawing Sheets

METHOD FOR MANUFACTURING CAPACITOR FOR SEMICONDUCTOR DEVICE

RELATED APPLICATION

This application claims the benefit of priority to Korean Application No. 10-2005-0063734, filed on Jul. 14, 2005, which is incorporated by reference herein in its entirety.

BACKGROUND

1. Technical Field

The present invention relates to a capacitor for a semiconductor device and, more specifically, to a capacitor having a metal-insulator-metal (MIM) structure for a semiconductor device.

2. Description of the Related Art

An image sensor, as a kind of semiconductor device, transforms optical images into electrical signals, and can be generally classified into a charge coupled device (CCD) and a CMOS image sensor.

A CCD comprises a plurality of photo diodes arranged in the form of a matrix to transform optical signal into electrical signal, a plurality of vertical charge coupled devices (VCCDs) formed between the photo diodes to transmit charges generated in each photo diode in a vertical direction, a plurality of horizontal charge coupled devices (HCCDs) for transmitting charges transmitted from each VCCDs in a horizontal direction, and a sense amplifier for sensing charges transmitted in the horizontal direction to output electrical signals.

CCDs have complicated operational mechanism, and high power consumption. In addition, the method for manufacturing a CCD is complicated, because multiple steps of photolithography processes are required. Especially, it is difficult to integrate a CCD with other devices such as control circuits, signal processing circuits, analog/digital converter, etc., in a single chip. Such disadvantages of CCDs prohibit miniaturization of products.

In order to overcome the disadvantages of CCDs, CMOS image sensors have been recently developed as the oncoming generation of image sensor. A CMOS image sensor generally comprises MOS transistors formed in a semiconductor substrate, and peripheral circuits such as control circuits, signal processing circuits, and the like, all of which may be formed by CMOS fabrication technologies. CMOS image sensors employ a switching mode in which the MOS transistors successively detect the output of each pixel. More specifically, a CMOS image sensor comprise a photo diode and MOS transistors in each pixel, thereby successively detecting electrical signals of each pixel in a switching mode to produce an image.

CMOS image sensors have advantages such as low power consumption and relatively simple fabrication process. In addition, CMOS image sensors can be integrated with control circuits, signal processing circuits, analog/digital converter, etc., using CMOS manufacturing technologies, resulting in miniaturization of products. CMOS image sensors have been widely used in a variety of applications such as digital still camera, digital video camera, and the like.

Meanwhile, in order to improve functions of semiconductor devices as in processing multimedia applications, memory cell arrays and peripheral circuits are highly integrated in one chip, and capacitors suitable for high-speed processing of a large volume of data become the key.

In general, capacitors for semiconductor devices can be classified into two types: one is a polysilicon-insulator-polysilicon (PIP) capacitor mainly used in DRAMs (Dynamic Random Access Memories) as an analog capacitor in sub-180 nm technologies; and the other is an MIM capacitor.

However, a problem with a PIP capacitor is that polysilicon used as upper and lower electrodes has a relatively high electrical resistivity and induces a parasitic capacitance because of a depletion phenomenon. For this reason, MIM capacitors are generally formed at sub-130 nm scales.

Hereinafter, a conventional method for manufacturing a capacitor in a semiconductor device will be described with reference to the accompanying drawings.

FIGS. 1A to 1D are cross-sectional views illustrating a conventional method for manufacturing a capacitor in a semiconductor device.

As shown in FIG. 1A, a first metal layer is deposited on a semiconductor substrate 100, and it is selectively removed by photolithography and etching processes, forming a lower electrode 110.

As shown in FIG. 1B, a dielectric layer 120 is formed on an entire surface of the semiconductor substrate 100, covering the lower electrode 110.

As shown in FIG. 1C, a second metal layer is deposited on the dielectric layer 120, and it is selectively removed by photolithography and etching processes, forming an upper electrode 130.

As shown in FIG. 1D, an interlevel dielectric layer 140 is formed over the entire surface of the semiconductor substrate 100, covering the upper electrode 130.

Next, the interlevel dielectric layer 140 is chemically and mechanically polished, in order to facilitate the subsequent process, especially a masking process. Particularly, a thickness of the interlevel dielectric layer 140 on the upper electrode 130 is controlled such that a top surface of the upper electrode 130 is not exposed, considering a minimum processing margin of the CMP (chemical mechanical polishing) process. In the above-described conventional method, the minimum thickness of the interlevel dielectric layer 140 over the upper electrode 130 is around 3000 Å, considering the above requirements including the processing margin of the CMP process.

SUMMARY

Embodiments consistent with the present invention provide a method for manufacturing a capacitor in a semiconductor device, which has a reduced thickness of an interlevel dielectric layer on an upper electrode.

A method for manufacturing a capacitor in a semiconductor device, consistent with the present invention, includes forming a lower electrode on a semiconductor substrate; forming a first interlevel dielectric layer on an entire surface of the semiconductor substrate, covering the lower electrode; selectively removing the first interlevel dielectric layer to form an opening exposing a surface of the lower electrode; sequentially forming a dielectric layer and a conductive layer over the entire surface of the semiconductor substrate including the opening; planarizing the conductive layer to form an upper electrode in the opening; and forming a second interlevel dielectric layer over the entire surface of the semiconductor substrate including the upper electrode.

Consistent with the present invention, a method for manufacturing a capacitor in a semiconductor device includes forming a lower electrode on a semiconductor substrate; forming a dielectric layer on an entire surface of the semiconductor substrate, covering the lower electrode; forming a first interlevel dielectric layer on the dielectric layer; selectively removing the first interlevel dielectric layer to form an opening exposing a surface of the dielectric layer; forming a conductive layer over the entire surface of the semiconductor substrate including the opening; planarizing the conductive layer to form an upper electrode in the opening; and forming a second interlevel dielectric layer over the entire surface of the semiconductor substrate including the upper electrode.

Embodiments consistent with the present invention also provide image sensors including capacitors manufactured by the methods consistent with the present invention.

These and other aspects of the invention will become evident by reference to the following description of the invention, often referring to the accompanying drawings.

DETAILED DESCRIPTION

Figure 1A:
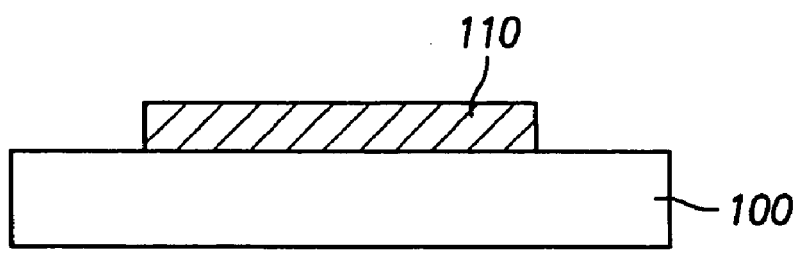
FIGS. 1A to 1D are cross-sectional views illustrating a conventional method for manufacturing a capacitor in a semiconductor device.
Figure 1B:
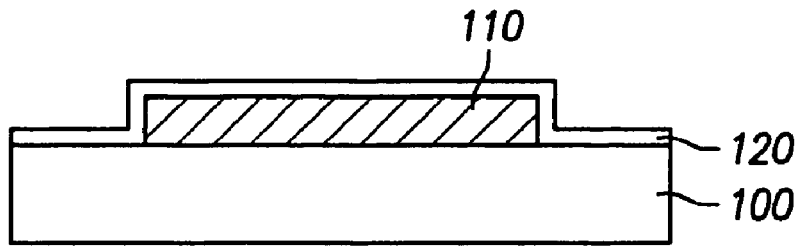
Figure 1C:
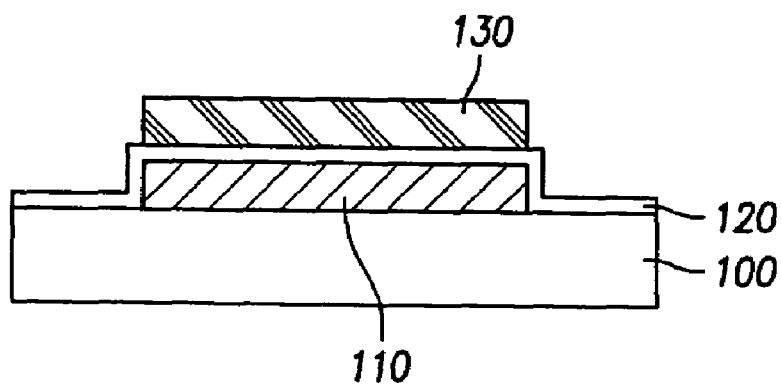
Figure 1D:
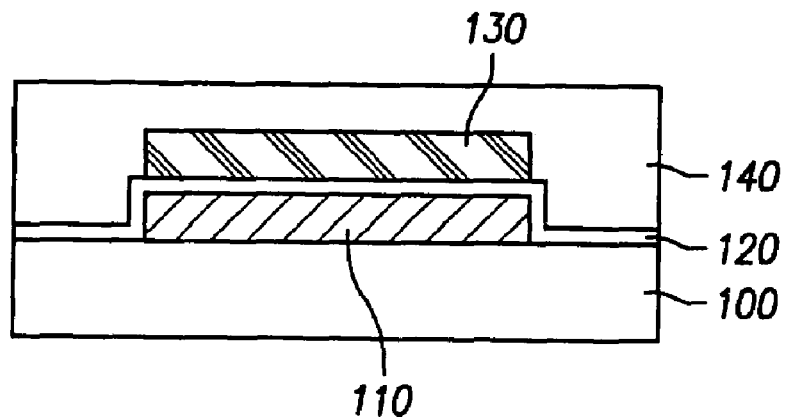
Figure 2A:
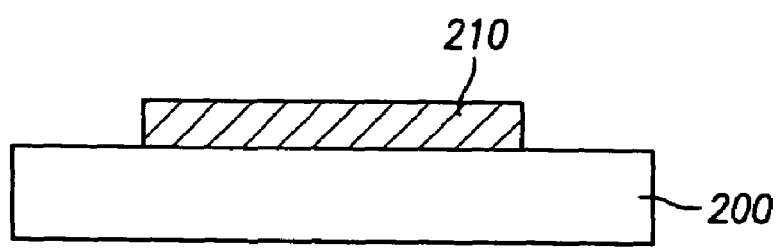
FIGS. 2A to 2F are cross-sectional views illustrating a method for manufacturing a capacitor in a semiconductor device, consistent with a first embodiment of the present invention.
Figure 2B:
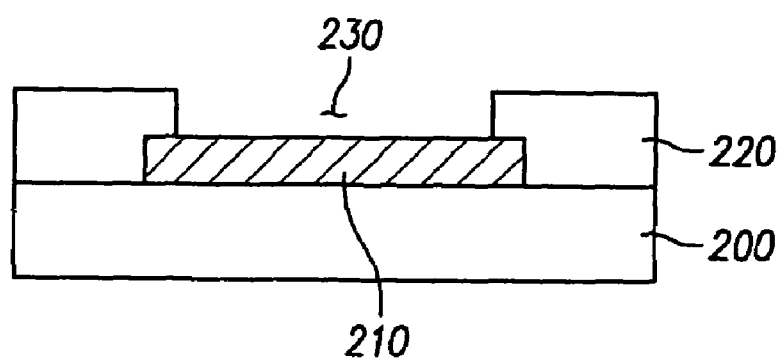
Figure 2C:
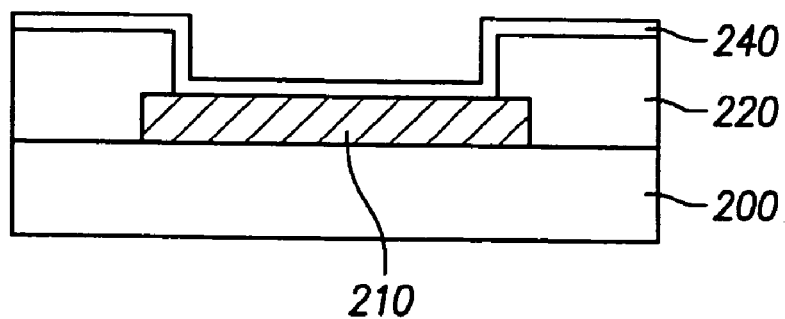
Figure 2D:
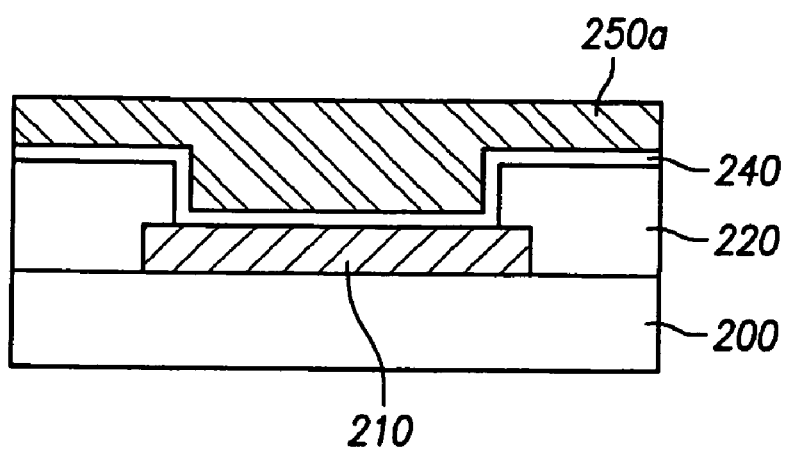
Figure 2E:
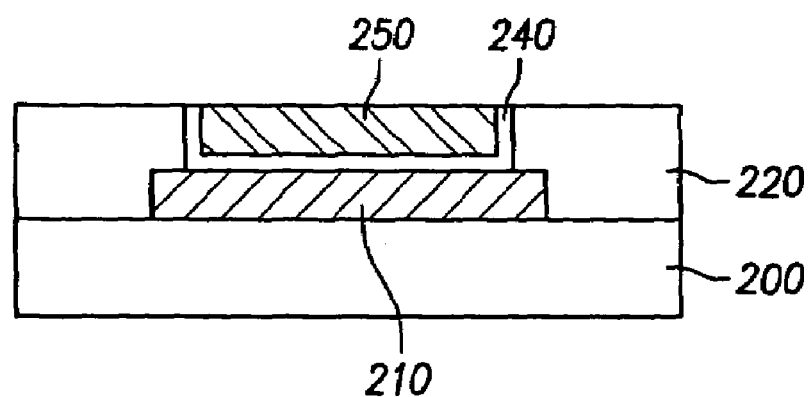
Figure 2F:
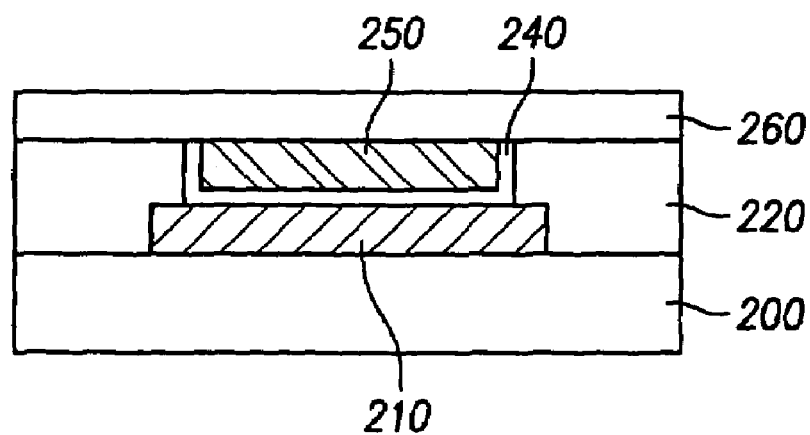

FIG. 2F shows capacitor for a semiconductor device consistent with the present invention, including a lower electrode 210 formed on a semiconductor substrate 200; a first interlevel dielectric layer 220 formed on an entire surface of the semiconductor substrate 200, including an opening exposing a surface of the lower electrode 210; an upper electrode 250 in the opening over the lower electrode 210; a dielectric layer 240 interposed between the lower electrode 210 and the upper electrode 250; and a second interlevel dielectric layer 260 formed over the entire surface of the semiconductor substrate 200, covering the upper electrode 250. Here, the second interlevel dielectric layer 260 is formed in a thickness of 300 Å~500 Å, using USG (Undoped Silicate Glass)

FIGS. 2A to 2F are cross-sectional views illustrating a method for manufacturing a capacitor in a semiconductor device consistent with a first embodiment of the present invention.

As shown in FIG. 2A, a first metal layer is deposited in a thickness of 500 Å~1000 Å on the semiconductor substrate 200 using a sputtering or chemical vapor deposition (CVD) process, and selectively removed by photolithography and etching processes to form a lower electrode 210. The first metal layer can be formed using any one selected from the group of aluminum (Al), copper (Cu), titanium/titanium nitride (Ti/TiN), platinum (Pt), tungsten (W), and their alloy.

As shown in FIG. 2B, a first interlevel dielectric layer 220 is formed on an entire surface of the semiconductor substrate 200, covering the lower electrode 210.

The first interlevel dielectric layer 220 is selectively removed by photolithography and etching processes, thus forming an opening 230 exposing a surface of the lower electrode 210.

As shown in FIG. 2C, a dielectric layer 240 is formed in a thickness of 500 Å~1000 Å over the entire surface of the semiconductor substrate 200 including the opening 230.

Here, the dielectric 240 can comprise any one selected from the group of ONO (Oxide-Nitride-Oxide), NO (Nitride-Oxide), NON (Nitride-Oxide-Nitride), BST (BaSrTiO$_3$), PZT(PbZrTiO$_3$), Ta$_2$O$_3$, and silicon nitride.

As shown in FIG. 2D, a second metal layer 250a is deposited on the dielectric layer 240.

Here, the second metal layer 250a can be formed using any one selected from the group of aluminum (Al), copper (Cu), titanium/titanium nitride (Ti/TiN), platinum (Pt), tungsten (W), and their alloy.

For example, the second metal layer 250a may include a combination of Ti/TiN with a TiN layer formed on a Ti layer, where the Ti layer has a thickness of approximately 400 Å~600 Å, and the TiN layer has a thickness of approximately 1000 Å~2000 Å on the Ti layer.

As shown in FIG. 2E, a CMP process is performed on the entire surface of the second metal layer 250a, thus forming an upper electrode 250 in the opening 230.

Here, the CMP process is performed to selectively polish the second metal layer 250a and the dielectric layer 240 on the first interlevel dielectric layer 220 using the surface of the first interlevel dielectric layer 220 as an end point. Therefore, the upper electrode 250 is formed completely in the opening 230.

As shown in FIG. 2F, a second interlevel dielectric layer 260 is formed over the entire surface of the semiconductor substrate 200, covering the upper electrode 250.

Here, the first interlevel dielectric layer 220 and the upper electrode 250 in the opening 230 are planarized by the CMP process, before the second interlevel dielectric layer 260 is formed. Accordingly, it is unnecessary to perform an additional CMP process for planarizing the second interlevel dielectric layer 260. Therefore, the second interlevel dielectric layer 260 can be formed with a minimum thickness to the extent that the upper electrode 250 is not exposed, without having to consider the processing margin for a CMP process.

FIGS. 3A to 3E are cross-sectional views illustrating a method for manufacturing a capacitor in a semiconductor device consistent with a second embodiment of the present invention.

Figure 3A:
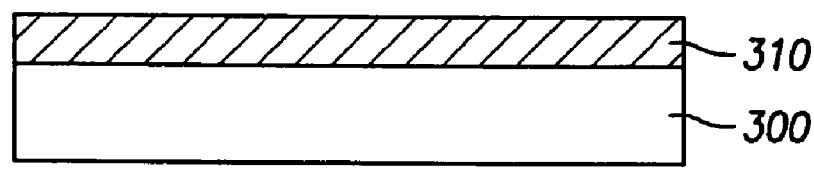
FIGS. 3A to 3E are cross-sectional views illustrating a method for manufacturing a capacitor in a semiconductor device, consistent with a second embodiment of the present invention.

As shown in FIG. 3A, a first metal layer is deposited in a thickness of 500 Å~1000 Å on a semiconductor substrate 300 using a sputtering or CVD process, and selectively removed by photolithography and etching processes, thus forming a lower electrode 310. The first metal layer can be formed using any one selected from the group of aluminum (Al), copper (Cu), titanium/titanium nitride (Ti/TiN), platinum (Pt), tungsten (W), and their alloy.

Figure 3B:
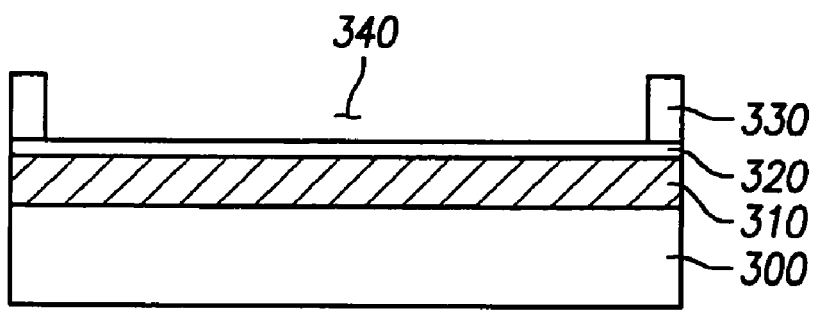

As shown in FIG. 3B, a dielectric layer 320 is formed in a thickness of 500 Å~1000 Å on an entire surface of the semiconductor substrate 300, covering the lower electrode 310. The dielectric layer 320 may comprise any one selected from the group of ONO (Oxide-Nitride-Oxide), NO (Nitride-Oxide), NON (Nitride-Oxide-Nitride), BST (BaSrTiO$_3$), PZT (PbZrTiO$_3$), Ta$_2$O$_3$, and silicon nitride.

A first interlevel dielectric layer 330 is formed on the dielectric layer 320, and then selectively removed by photolithography and etching processes, thus forming an opening 340 exposing a surface of the dielectric layer 320.

Figure 3C:
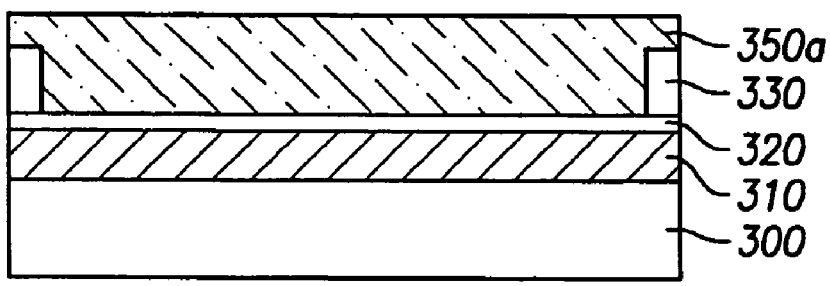

As shown in FIG. 3C, a second metal layer 350a is deposited over the entire surface of the semiconductor substrate 300, filling in the opening 340. The second metal layer 350a may comprise any one selected from the group of aluminum (Al), copper (Cu), titanium/titanium nitride (Ti/TiN), platinum (Pt), tungsten (W), and their alloy. For example, the second metal layer 350a may comprise a combination of Ti/TiN with a TiN layer on a Ti layer, where the Ti layer has a thickness of approximately 400 Å~600 Å, and the TiN layer has a thickness of approximately 1000 Å~2000 Å.

Figure 3D:
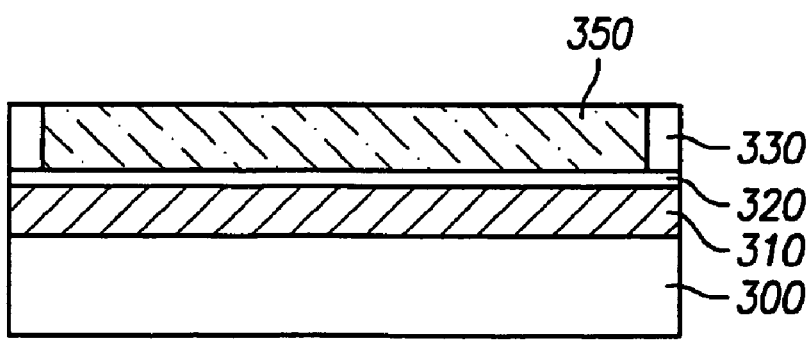

As shown in FIG. 3D, a CMP process is performed on the entire surface of the second metal layer 350a, thus forming an upper electrode 350 in the opening 340. Here, the CMP process is performed to selectively polish the second metal layer 350a on the first interlevel dielectric layer 330 using the surface of the first interlevel dielectric layer 330 as an end point. Therefore, the upper electrode 350 is formed completely in the opening 340.

Figure 3E:
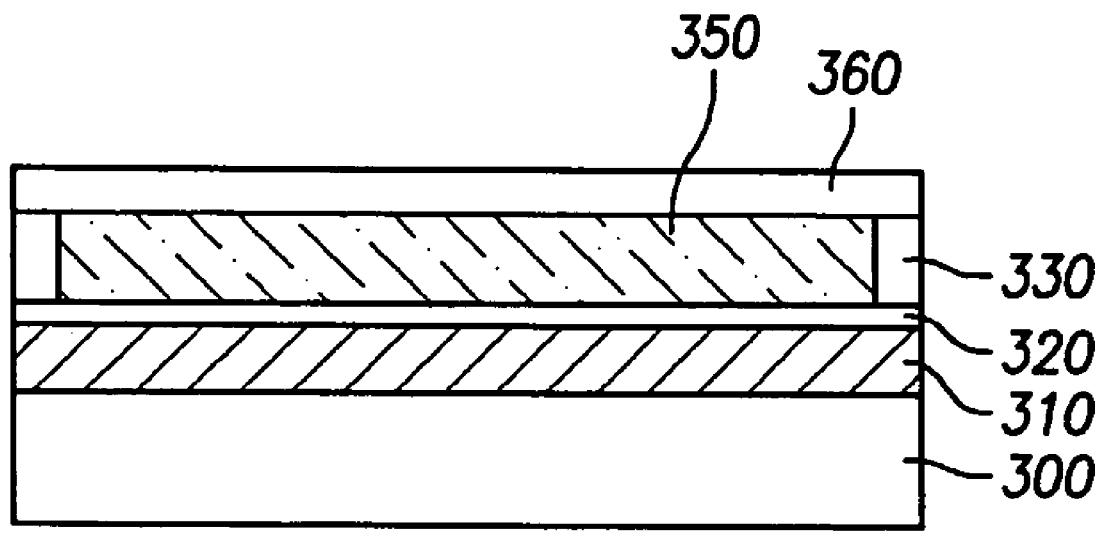

As shown in FIG. 3E, a second interlevel dielectric layer 360 is formed over the entire surface of the semiconductor substrate 300, using a USG (Undoped Silicate Glass) material. The thickness of the second interlevel dielectric layer 360 may range from 300 Å~500 Å, but can be further reduced to a minimum as long as it can function as an insulating layer.

Here, the first interlevel dielectric layer 330 and the upper electrode 350 in the opening 340 are planarized by the CMP process for forming the upper electrode 350, before the second interlevel dielectric layer 360 is formed. Accordingly, it is unnecessary to perform an additional CMP process for planarizing the second interlevel dielectric layer 360. Therefore, the second dielectric layer 360 can be formed with a minimum thickness to the extent that the upper electrode 350 is not exposed, without having to consider the processing margin for a CMP process.

Figure 4:
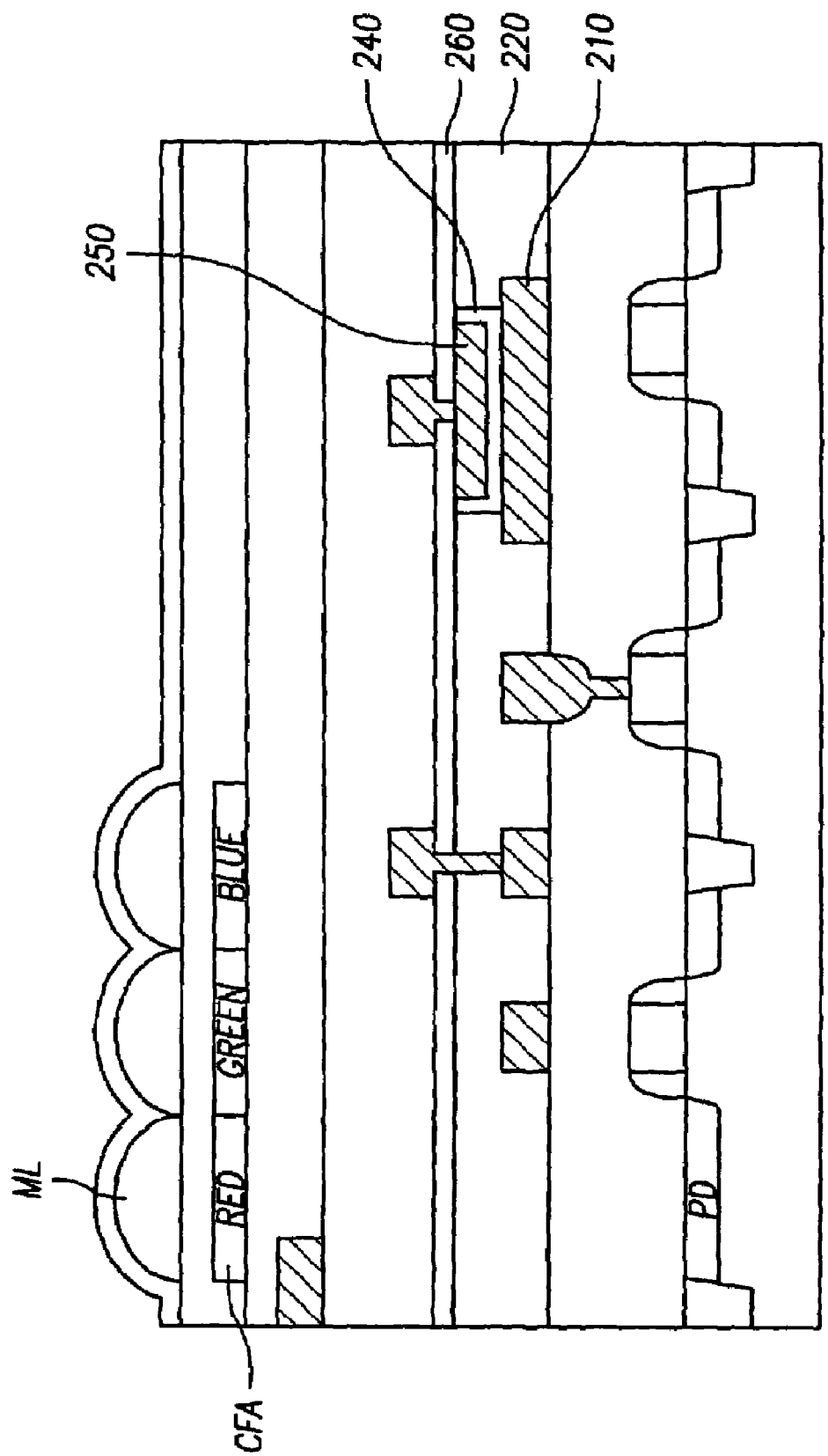
FIG. 4 is a cross-sectional view illustrating a CMOS image sensor including a capacitor manufactured by a method consistent with the present invention.

After forming a capacitor for a semiconductor device by a method consistent with the first or second embodiment of the present invention, typical manufacturing processes can be performed to manufacture a semiconductor device in which a capacitor element is integrated. The present invention can be applied for manufacturing an image sensor, especially a CMOS image sensor. For example, a CMOS image sensor including a capacitor element manufactured according to the first embodiment of the present invention is illustrated in FIG. 4. Referring to FIG. 4, a capacitor comprising the lower electrode 210, the dielectric layer 240, and the upper electrode 250 is formed on the predetermined device structure, along with the first and second interlevel dielectric layers 220 and 260 covering the capacitor. After forming the capacitor, the CMOS image sensor is completed by forming color filter arrays (CFA) and microlenses (ML). Consistent with the present invention, the thickness of the interlevel dielectric layer 260 on the upper electrode can be reduced, e.g., to about 300 Å~500 Å. In contrast, in conventional CMOS image sensors, the corresponding interlevel dielectric layer has a thickness of at least 3000 Å.

The above-described method for manufacturing a capacitor in a semiconductor device consistent with the present invention has advantages as follows.

First, an interlevel dielectric layer formed on an upper electrode has a minimum thickness so that performances of an image sensor are improved.

Second, an upper electrode of an MIM capacitor is formed in a hole-shape of opening so that damages to the dielectric layer can be prevented during the formation of the upper electrode, and the reliability of devices can be improved.

Third, white defects of an image sensor, due to metal particles that can be generated during the formation of an upper electrode, can be effectively prevented, because the upper electrode is formed in the hole-shape of opening.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for manufacturing a capacitor in a semiconductor device, comprising:
   forming a lower electrode on a semiconductor substrate;
   forming a dielectric layer on an entire surface of the semiconductor substrate, covering the lower electrode;
   forming a first interlevel dielectric layer on the dielectric layer;
   selectively removing the first interlevel dielectric layer to form an opening exposing a surface of the dielectric layer without exposing the lower electrode;
   forming a conductive layer over the entire surface of the semiconductor substrate including the opening;
   planarizing the conductive layer to form an upper electrode in the opening; and
   forming a second interlevel dielectric layer over the entire surface of the semiconductor substrate including the upper electrode.

2. The method of claim 1, wherein forming the second interlevel dielectric layer comprises forming a layer of USG (Undoped Silicate Glass).

3. The method of claim 1, wherein forming the second interlevel dielectric layer comprises forming the second interlevel dielectric layer to a thickness of 300 Å~500 Å.

4. The method of claim 1, wherein forming the conductive layer comprises forming a layer of material selected from a group consisting of aluminum (Al), copper (Cu), titanium/titanium nitride (Ti/TiN), platinum (Pt), tungsten (W), and alloy thereof.

5. The method of claim 1, wherein forming the dielectric layer comprises forming a layer of material selected from a group of ONO (Oxide-Nitride-Oxide), NO (Nitride-Oxide), NON (Nitride-Oxide-Nitride), BST ($BaSrTiO_3$), PZT ($PbZrTiO_3$), $Ta_2O_3$, and silicon nitride.

6. The method of claim 1, wherein planarizing the conductive layer comprises selectively polishing the conductive layer using a top surface of the first interlevel dielectric layer as an end point.

* * * * *